US 11,310,951 B2

(12) United States Patent
Onishi

(10) Patent No.: US 11,310,951 B2
(45) Date of Patent: Apr. 19, 2022

(54) SUBSTRATE WORKING DEVICE AND COMPONENT MOUNTING DEVICE

(71) Applicant: YAMAHA HATSUDOKI KABUSHIKI KAISHA, Iwata (JP)

(72) Inventor: Tadashi Onishi, Iwata (JP)

(73) Assignee: YAMAHA HATSUDOKI KABUSHIKI KAISHA, Shizaoka-ken (JP)

( * ) Notice: Subject to any disclaimer, the term of this patent is extended or adjusted under 35 U.S.C. 154(b) by 757 days.

(21) Appl. No.: 16/090,973

(22) PCT Filed: Apr. 6, 2016

(86) PCT No.: PCT/JP2016/061310
§ 371 (c)(1),
(2) Date: Oct. 3, 2018

(87) PCT Pub. No.: WO2017/175339
PCT Pub. Date: Oct. 12, 2017

(65) Prior Publication Data
US 2019/0124806 A1 Apr. 25, 2019

(51) Int. Cl.
*H05K 13/08* (2006.01)
*H05K 13/04* (2006.01)

(52) U.S. Cl.
CPC ....... *H05K 13/0812* (2018.08); *H05K 13/041* (2018.08); *H05K 13/0813* (2018.08); *H05K 13/0815* (2018.08)

(58) Field of Classification Search
CPC ............. H05K 13/0812; H05K 13/041; H05K 13/0813; H05K 13/0815

USPC .................................. 29/833, 729, 739, 740
See application file for complete search history.

(56) References Cited

U.S. PATENT DOCUMENTS

2014/0300730 A1  10/2014  Onishi

FOREIGN PATENT DOCUMENTS

| CN | 101163395 A | 4/2008 |
| CN | 103025142 A | 4/2013 |
| JP | 2004-103924 A | 4/2004 |
| JP | 2005-011950 A | 1/2005 |
| JP | 2005-197564 A | 7/2005 |
| JP | 4091950 B2 | 5/2008 |
| JP | 2008-227400 A | 9/2008 |
| JP | 4343710 B2 | 10/2009 |
| JP | 2014-203938 A | 10/2014 |
| JP | 2014-212235 A | 11/2014 |

(Continued)

OTHER PUBLICATIONS

International Search Report issued in PCT/JP2016/061310; dated Jun. 7, 2016.

(Continued)

Primary Examiner — Peter Dungba Vo
Assistant Examiner — Azm A Parvez
(74) Attorney, Agent, or Firm — Studebaker & Brackett PC

(57) ABSTRACT

A substrate working device includes a working unit that performs work on a substrate on which a component is mounted, an imager capable of imaging a correction mark for position correction, and a mark projector that projects the correction mark. The correction mark includes a first correction mark and a second correction mark. The mark projector projects the first correction mark to a first height and projects the second correction mark to a second height.

19 Claims, 3 Drawing Sheets

(56) References Cited

FOREIGN PATENT DOCUMENTS

WO          2015/181905  A1      12/2015
WO     WO-2015181905  A1  *  12/2015    ........... H05K 13/041

OTHER PUBLICATIONS

Written Opinion issued in PCT/JP2016/061310; dated Jun. 7, 2016.
International Preliminary Report on Patentability issued in PCT/JP2016/061310; dated Sep. 19, 2017.
An Office Action mailed by the Chinese Patent Office dated Dec. 18, 2019, which corresponds to Chinese Patent Application No. 201680084106.1 and is related to U.S. Appl. No. 16/090,973; with English language translation.

* cited by examiner

SUBSTRATE WORKING DEVICE AND COMPONENT MOUNTING DEVICE

CROSS-REFERENCE TO RELATED APPLICATION

This application is a National Stage of International Patent Application No. PCT/JP2016/061310, filed Apr. 6, 2016, the entire content of which is incorporated herein by correction.

BACKGROUND

Technical Field

The present disclosure relates to a substrate working device and a component mounting device, and more particularly, it relates to a substrate working device and a component mounting device including correction marks for position correction.

Background Art

In general, a component mounting device including correction marks for position correction is known. Such a component mounting device is disclosed in International Publication No. WO2015/181905, for example.

International Publication WO2015/181905 described above discloses a component mounting device including a head unit that mounts components on a substrate, base cameras and a scan camera capable of imaging correction marks for position correction, bar-like members on which the correction marks to be imaged by the base cameras are disposed, and mark projectors that project the correction marks to be imaged by the scan camera. In this component mounting device, the correction marks disposed on the bar-like members and the correction marks projected by the mark projectors are disposed at heights different from each other according to the focal heights of the base cameras and the focal height of the scan camera.

SUMMARY

In the component mounting device disclosed in International Publication WO2015/181905 described above, in order to dispose a plurality of correction marks at the different heights, it is necessary to provide the bar-like members and the mark projectors. Therefore, as the number of components increases, the structure of the component mounting device becomes complicated. In addition, spaces in which both the bar-like members and the mark projectors are disposed are provided, and thus the component mounting device increases in size. Therefore, it is desired to simplify the structures of a substrate working device and a component mounting device in which a plurality of correction marks are disposed at different heights and downsize the substrate working device and the component mounting device.

The present disclosure provides a substrate working device and a component mounting device, in which a plurality of correction marks are disposed at different heights, each having a simplified structure and decreasing in size.

A substrate working device according to a first aspect of the present disclosure includes a working unit that performs work on a substrate on which a component is mounted, an imager capable of imaging a correction mark for position correction, and a mark projector that projects the correction mark. The correction mark includes a first correction mark and a second correction mark, the imager includes a first imager focused at a first height and a second imager focused at a second height different from the first height, and the mark projector projects the first correction mark to the first height and projects the second correction mark to the second height.

As described above, the substrate working device according to the first aspect of the present disclosure includes the mark projector that projects the first correction mark to the first height and projects the second correction mark to the second height different from the first height. Thus, a member that disposes the first correction mark and a member that disposes the second correction mark can be provided as one common mark projector, and thus an increase in the number of components can be significantly reduced or prevented. Consequently, it is possible to simplify the structure of the substrate working device in which a plurality of correction marks are disposed at different heights and downsize the substrate working device. Note that the mark projector is not restricted to a structure that projects an image by emitting light from an illuminator, but the mark projector also includes a structure that projects an image without an illuminator that emits light.

In the aforementioned substrate working device according to the first aspect, the mark projector preferably includes a first projection target projected as the first correction mark, a second projection target projected as the second correction mark, and a lens unit that projects the first projection target as the first correction mark to the first height and projects the second projection target as the second correction mark to the second height. According to this structure, the lens unit projects the first projection target such that the first correction mark can be easily projected, and the lens unit projects the second projection target such that the second correction mark can be easily projected.

In the aforementioned structure in which the mark projector includes the first projection target, the second projection target, and the lens unit, the first projection target is preferably disposed further away from the lens unit than the second projection target in an optical axis direction of the lens unit. According to this structure, the height of the first correction mark and the height of the second correction mark can easily be made different from each other.

In this case, the mark projector preferably further includes a transparent member having a flat plate shape and including a pair of flat surfaces that face each other in the optical axis direction of the lens unit, the first projection target is preferably disposed on one of the flat surfaces of the transparent member, and the second projection target is preferably disposed on the other of the flat surfaces of the transparent member. According to this structure, the first projection target and the second projection target can be provided on one transparent member, and thus an increase in the number of components can be further significantly reduced or prevented. Consequently, it is possible to downsize the mark projector and simplify the structure thereof, and thus it is possible to further downsize the substrate working device and simplify the structure thereof.

In the aforementioned structure in which the mark projector includes the first projection target, the second projection target, and the lens unit, the first projection target is preferably disposed such that an optical axis of the lens unit passes substantially through a center of the first projection target, and the second projection target is preferably disposed such that the optical axis of the lens unit passes substantially through a center of the second projection target. According to this structure, distortion of the projected first correction mark and second correction mark can be significantly reduced or prevented, and thus accurate position correction can be performed using the first correction mark and the second correction mark.

In the aforementioned structure in which the mark projector includes the first projection target, the second projection target, and the lens unit, the first projection target and the second projection target preferably do not overlap each other as viewed in an optical axis direction of the lens unit. According to this structure, projection of the first correction mark and the second correction mark in an overlapping manner can be significantly reduced or prevented, and thus the first correction mark and the second correction mark can be accurately recognized based on the imaging result by the imager.

In the aforementioned structure in which the mark projector includes the first projection target, the second projection target, and the lens unit, the first projection target and the second projection target preferably have planar shapes different from each other. According to this structure, erroneous recognition of the first correction mark and the second correction mark imaged by the imager can be significantly reduced or prevented, and thus the first correction mark and the second correction mark can be accurately recognized.

In the aforementioned structure in which the mark projector includes the first projection target, the second projection target, and the lens unit, one of the first projection target and the second projection target is preferably disposed inside the other of the first projection target and the second projection target as viewed in an optical axis direction of the lens unit. According to this structure, the first projection target and the second projection target can be disposed on the optical axis, and thus distortion of the projected first correction mark and second correction mark can be significantly reduced or prevented. Furthermore, the first projection target and the second projection target can be disposed compactly, and thus the mark projector can be downsized.

In the aforementioned structure in which the mark projector includes the first projection target, the second projection target, and the lens unit, the mark projector preferably further includes an illuminator that emits light to the first projection target and the second projection target. According to this structure, the first correction mark and the second correction mark can be projected by emitting light to the first projection target and the second projection target, and thus the first correction mark and the second correction mark can be clearly projected.

In the aforementioned substrate working device according to the first aspect, the mark projector preferably includes a pair of mark projectors provided at a predetermined interval in a horizontal direction. According to this structure, the correction marks can be disposed at two locations in the horizontal direction. Consequently, when distortion occurs in the working unit due to heat or the like, for example, a plurality of reference positions for the working unit can be recognized with the correction marks, and thus positional deviation due to the distortion can be accurately corrected.

In the aforementioned substrate working device according to the first aspect, the imager includes the first imager focused at the first height and the second imager focused at the second height. Thus, the component or the like located at the first height is imaged by the first imager such that position correction can be accurately performed, and the component or the like located at the second height different from the first height is imaged by the second imager such that position correction can be accurately performed.

A component mounting device according to a second aspect of the present disclosure includes a mounting head unit that mounts a component on a substrate, an imager capable of imaging a correction mark for position correction, and a mark projector that projects the correction mark, the correction mark includes a first correction mark and a second correction mark, the imager includes a first imager focused at a first height and a second imager focused at a second height different from the first height, and the mark projector projects the first correction mark to the first height and projects the second correction mark to the second height.

As described above, the component mounting device according to the second aspect of the present disclosure includes the mark projector that projects the first correction mark to the first height and projects the second correction mark to the second height different from the first height. Thus, a member that disposes the first correction mark and a member that disposes the second correction mark can be provided as one common mark projector, and thus an increase in the number of components can be significantly reduced or prevented. Consequently, it is possible to simplify the structure of the component mounting device in which a plurality of correction marks are disposed at different heights and downsize the component mounting device.

In the aforementioned component mounting device according to the second aspect, the mark projector is preferably provided on the mounting head unit, and preferably projects the first correction mark and the second correction mark downward. According to this structure, the component held by the mounting head unit can be imaged together with the first correction mark or the second correction mark, and thus the position of the component can be accurately corrected. Consequently, the component can be accurately mounted on the substrate.

In this case, a first imager focused at the first height is preferably fixedly provided on a main body of the component mounting device, and the second imager focused at the second height is preferably movably provided on the mounting head unit. According to this structure, the component located at the first height is imaged by the first imager such that position correction can be accurately performed, and the component located at the second height different from the first height is imaged by the second imager such that position correction can be accurately performed.

According to the present disclosure, as described above, the substrate working device and the component mounting device, in which the plurality of correction marks are disposed at the different heights, each having a simplified structure and decreasing in size can be provided.

DETAILED DESCRIPTION

An embodiment embodying the present disclosure is hereinafter described on the basis of the drawings.

(Structure of Component Mounting Device)

The structure of a component mounting device 100 according to an embodiment of the present disclosure is now described with reference to FIG. 1.

Figure 1:
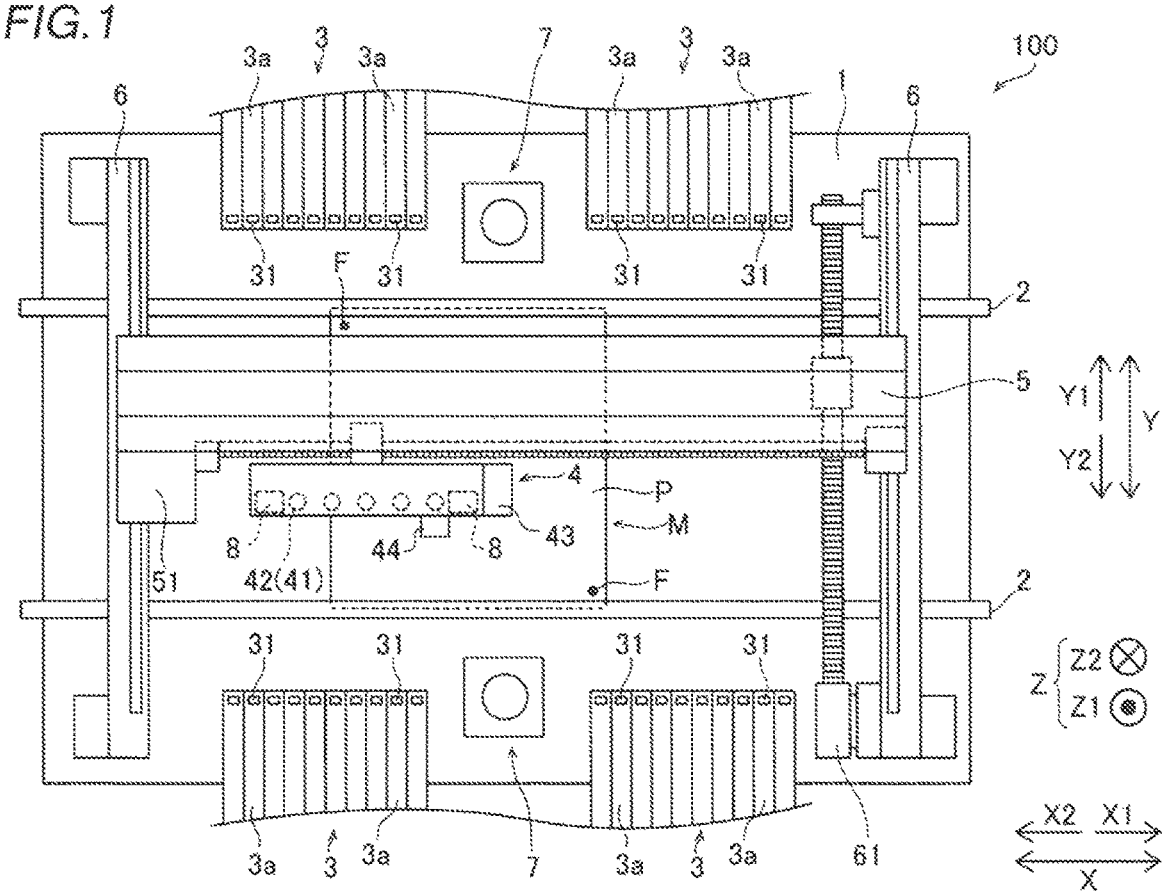
FIG. 1 is plan view showing schematically showing a component mounting device according to an embodiment of the present disclosure.

As shown in FIG. 1, the component mounting device 100 is a component mounting device that conveys a substrate P in a direction X by a pair of conveyors 2 and mounts components 31 on the substrate P at a mounting operation position M. The component mounting device 100 is an example of a "substrate working device" in the claims.

As shown in FIG. 1, the component mounting device 100 includes a base 1, the pair of conveyors 2, component feeders 3, a head unit 4, and a support 5, a pair of rails 6, base cameras 7, and mark projectors 8. The head unit 4 is an example of a "working unit" or a "mounting head unit" in the claims, and the base cameras 7 are examples of an "imager" or a "first imager" in the claims.

The pair of conveyors 2 are installed on the base 1 and convey the substrate P in the direction X. In addition, the pair of conveyors 2 hold the substrate P being conveyed in a stopped state at the mounting operation position M. Moreover, an interval between the pair of conveyors 2 in a direction Y can be adjusted according to the dimensions of the substrate P.

The component feeders 3 are disposed outside (Y1 and Y2 sides) of the pair of conveyors 32. A plurality of tape feeders 3a are disposed in the component feeders 3.

The tape feeders 3a hold reels (not shown) on which tapes that hold a plurality of components 31 at a predetermined interval are wound. The tape feeders 3a feed the components 31 from the tips of the tape feeders 3a by rotating the reels to feed the tapes that hold the components 31. The components 31 include electronic components such as ICs, transistors, capacitors, and resistors.

Figure 2:
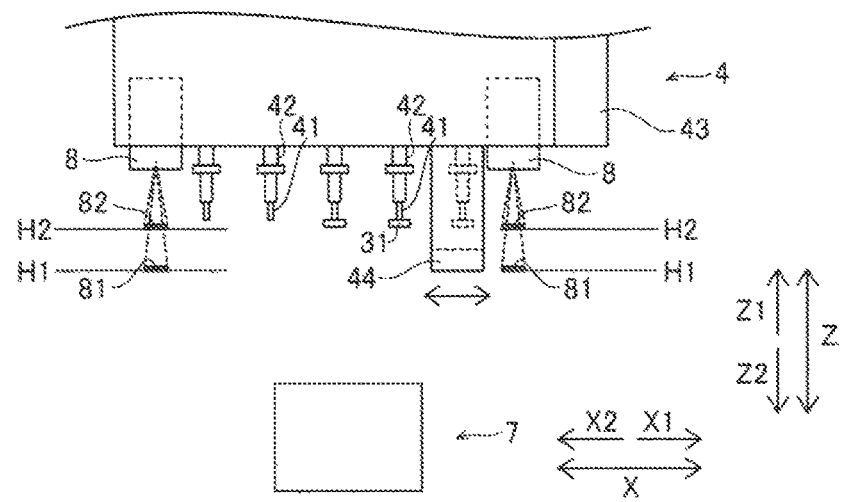
FIG. 2 is a diagram illustrating the heights of correction marks of the component mounting device according to the embodiment of the present disclosure.

The head unit 4 performs work on the substrate P on which the components 31 are mounted. Specifically, the head unit 4 is disposed above (direction Z1) the pair of conveyors 2 and the component feeders 3. As shown in FIG. 2, the head unit 4 includes a plurality of (five) mounting heads 42 including nozzles 41 attached to their lower ends and a substrate recognition camera 43, and a scan camera 44. The scan camera 44 is an example of an "imager" or a "second imager" in the claims.

The mounting heads 42 are movable up and down (movable in a direction Z), suction and hold the components 31 fed from the tape feeders 3a by a negative pressure generated at the tips of the nozzles 41 by a negative pressure generator (not shown), and mount the components 31 at mounting positions (see FIG. 2) on the substrate P.

The substrate recognition camera 43 images fiducial marks F of the substrate P in order to recognize the position of the substrate P. The positions of the fiducial marks F are imaged and recognized such that the mounting positions of the components 31 on the substrate P can be accurately acquired. An illuminator (not shown) is provided in the vicinity of the substrate recognition camera 43. Visible light is emitted from the illuminator to the substrate P when the substrate recognition camera 43 captures an image such that the substrate P can be clearly imaged by the substrate recognition camera 43.

The scan camera 44 can image the components 31 suctioned by the mounting heads 42 (nozzles 41) from the lower side (Z2 direction side). The scan camera 44 is provided to acquire the positions and orientations of the components 31 suctioned by the mounting heads 42 (nozzles 41). Specifically, the scan camera 44 is movable in an array direction (direction X) of the mounting heads 42 with respect to the head unit 4. Furthermore, the scan camera 44 images the components 31 suctioned by the mounting heads 42 (nozzles 41) and a correction mark (second correction mark 82) described below while moving in the direction X. The scan camera 44 images the components 31 each having a relatively small thickness (a size in the direction Z). An illuminator (not shown) is provided in the vicinity of the scan camera 44. Visible light is emitted from the illuminator to the components 31 suctioned by the nozzles 41 when the scan camera 44 captures an image such that the components 31 suctioned by the nozzles 41 can be clearly imaged by the scan camera 44.

The support 5 includes a motor 51. The support 5 moves the head unit 4 in the direction X along the support 5 by driving the motor 51. Both ends of the support 5 are supported by the pair of rails 6.

The pair of rails 6 are fixed on the base 1. A rail 6 on the X1 side includes a motor 61. The pair of rails 6 movably supports the support 5 in the direction Y perpendicular to the direction X. Specifically, the rails 6 move the support 5 in the direction Y along the pair of rails 6 by driving the motor 61. The head unit 4 is movable in the direction X along the support 5, and the support 5 is movable in the direction Y along the rails 6 such that the head unit 4 is movable in the directions X and Y.

The base cameras 7 are fixed on the upper surface of the base 1. The base cameras 7 can image the components. Specifically, the base cameras 7 are disposed outside (Y1 and Y2 sides) of the pair of conveyors 2. The base cameras 7 image the components 31 suctioned by the mounting heads 42 (nozzles 41) from the lower side (Z2 direction side) in order to recognize the suction states (suction attitudes) of the components 31 prior to mounting of the components 31. Thus, the suction states of the components 31 suctioned by the mounting heads 42 (nozzles 41) can be acquired. Illuminators (not shown) are provided in the vicinity of the base cameras 7. Visible light is emitted from the illuminators to the components 31 suctioned by the nozzles 41 when the base cameras 7 capture images such that the components 31 suctioned by the nozzles 41 can be clearly imaged by the base cameras 7.

The base cameras 7 image the components 31 suctioned by the mounting heads 42 (nozzles 41) and a correction mark (first correction mark 81) described below. Specifically, when the components 31 are suctioned by the mounting heads 42 (nozzles 41), the head unit 4 moves so as to pass above the base cameras 7. At this time, the base cameras 7 image the components 31 suctioned by the mounting heads 42 (nozzles 41) and the correction mark (first correction mark 81). Furthermore, the base cameras 7 image the components 31 each having a relatively large thickness (a size in the direction Z) and the components 31 each having a shape difficult to image for the scan camera 44, for example.

Figure 3:
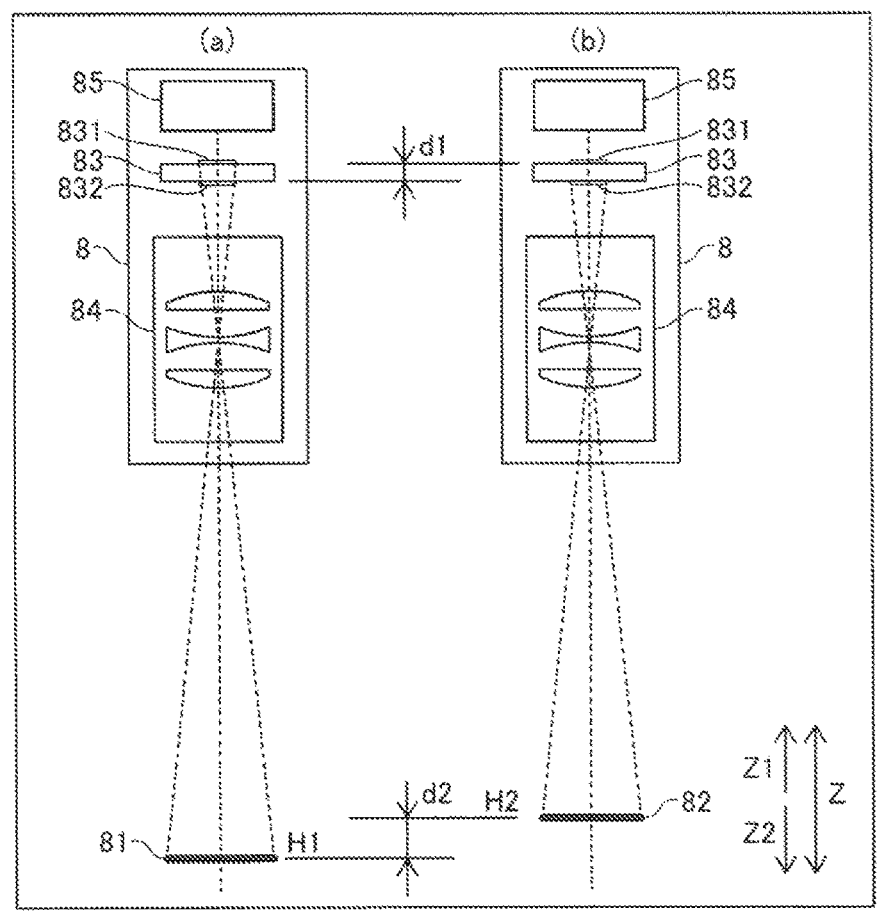
FIG. 3 is a diagram illustrating mark projectors of the component mounting device according to the embodiment of the present disclosure.

According to the present embodiment, as shown in FIGS. 2 and 3, the mark projectors 8 project the correction marks (the first correction mark 81 and the second correction mark 82). A pair of mark projectors 8 are provided at a predetermined interval in a horizontal direction. Specifically, the pair of mark projectors 8 are provided on the head unit 4. The mark projectors 8 sandwich the plurality of mounting heads 42 disposed in a row in the direction X therebetween. That is, the pair of mark projectors 8 are provided at the predetermined interval in the direction X. The mark projectors 8 project the first correction mark 81 and the second correction mark 82 downward.

According to the present embodiment, the mark projectors 8 project the first correction mark 81 to a first height H1, as shown in part (a) of FIG. 3. Furthermore, the mark projectors 8 project the second correction mark 82 to a second height H2 different from the first height H1, as shown in part (b) of FIG. 3. The base cameras 7 are focused at the first height H1. In other words, the base cameras 7 image the components 31 located at the first height H1. On the other hand, the scan camera 44 is focused at the second height H2 different from the first height H1. In other words, the scan camera 44 images the components 31 located at the second height H2. The first height H1 is lower (direction Z2) than the second height H2. Although part (a) of FIG. 3 shows a state in which the first correction mark 81 is projected and part (b) of FIG. 3 shows a state in which the second correction mark 82 is projected, actually, the mark projectors 8 project both the first correction mark 81 and the second correction mark 82. The first correction mark 81 and the second correction mark 82 are examples of a "correction mark" in the claims.

The positions of the first correction mark 81 and the second correction mark 82 in the horizontal direction (directions X and Y) are known positions with respect to the head unit 4. That is, the first correction mark 81 or the second correction mark 82 and the components 31 held by the mounting heads 42 are imaged such that the positions of the components 31 can be accurately acquired. Based on the acquired positions of the components 31, positions for mounting the components 31 are corrected.

As shown in FIG. 3, each of the mark projectors 8 includes a transparent member 83, a lens unit 84, and an illuminator 85. The transparent member 83 includes a first projection target 831 projected as the first correction mark 81 and a second projection target 832 projected as the second correction mark 82. Specifically, the transparent member 83 has a flat plate shape, and a pair of flat surfaces of the transparent member 83 face each other in the optical axis direction of the lens unit 84. The first projection target 831 is disposed on one of the flat surfaces of the transparent member 83, and the second projection target 832 is disposed on the other of the flat surfaces of the transparent member 83.

Figure 4:
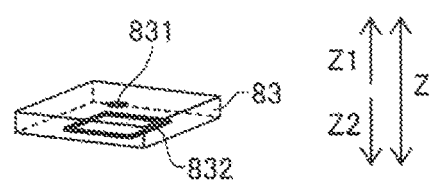
FIG. 4 is a perspective view showing a transparent member of the component mounting device according to the embodiment of the present disclosure.

The first projection target 831 is disposed such that the optical axis of the lens unit 84 passes substantially through the center of the first projection target 831. The second projection target 832 is disposed such that the optical axis of the lens unit 84 passes substantially through the center of the second projection target 832. The first projection target 831 is disposed further away from the lens unit 84 than the second projection target 832 in the optical axis direction of the lens unit 84. That is, as shown in FIG. 4, the first projection target 831 is disposed on the upper (Z1 direction side) surface of the transparent member 83. The second projection target 832 is disposed on the lower (Z2 direction side) surface of the transparent member 83.

The first projection target 831 and the second projection target 832 are provided by depositing a material on the surfaces of the transparent member 83. The first projection target 831 and the second projection target 832 are opaque to light. Specifically, the first projection target 831 and the second projection target 832 are colored. For example, the first projection target 831 and the second projection target 832 are black-colored. As shown in FIG. 3, the first projection target 831 and the second projection target 832 are spaced apart from each other in an upward-downward direction (direction Z) by the thickness of the transparent member 83. Specifically, the first projection target 831 and the second projection target 832 are spaced apart from each other by a distance d1 in the upward-downward direction.

As shown in FIG. 3, the first projection target 831 and the second projection target 832 are spaced apart from each other by the distance d1 in the upward-downward direction, and thus the first correction mark 81 and the second correction mark 82 are projected (imaged) to different heights. Specifically, the first correction mark 81 is projected to the first height H1. The second correction mark 82 is projected to the second height H2. The first height H1 is lower (direction Z2) by a distance d2 than the second height H2. That is, the first correction mark 81 projected by projecting the first projection target 831 disposed further away from the lens unit 84 is projected further away from the lens unit 84. The second correction mark 82 projected by projecting the second projection target 832 disposed closer to the lens unit 84 is projected closer to the lens unit 84.

The transparent member 83 is made of a transparent or translucent material. The transparent member 83 is made of a material having a high refractive index. For example, the transparent member 83 is made of glass, resin, or the like. The transparent member 83 is made of a material having a refractive index larger than that of water. Preferably, the transparent member 83 is made of a material having a refractive index of 1.5 or more. Accordingly, an optical path length between the upper surface and the lower surface of the transparent member 83 can be increased, and thus the thickness of the transparent member 83 can be reduced. Thus, the mark projectors 8 can be downsized.

Figure 5:
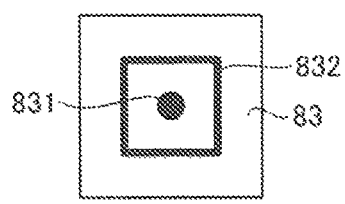
FIG. 5 is a plan view showing the transparent member of the component mounting device according to the embodiment of the present disclosure.

According to the present embodiment, the first projection target 831 and the second projection target 832 do not overlap each other as viewed in the optical axis direction of the lens unit 84. Specifically, as shown in FIG. 5, the first projection target 831 is disposed inside the second projection target 832 as viewed in the optical axis direction of the lens unit 84. The first projection target 831 and the second projection target 832 have planar shapes different from each other. For example, the first projection target 831 has a circular shape as viewed in the optical axis direction. The second projection target 832 has a quadrangular frame shape as viewed in the optical axis direction.

As shown in FIG. 3, the lens unit 84 is provided to project the first projection target 831 as the first correction mark 81 to the first height H1 and projects the second projection target 832 as the second correction mark 82 to the second height H2. The lens unit 84 is disposed below (Z2 direction side) the transparent member 83 (the first projection target 831 and the second projection target 832). The lens unit 84 includes three lenses, for example. The position and the magnification of the lens unit 84 are adjusted such that the projection position of the first correction mark 81 is at the first height H1. Furthermore, the position and the magnification of the lens unit 84 are adjusted such that the projection position of the second correction mark 82 is at the second height H2.

The illuminator 85 emits light to the first projection target 831 and the second projection target 832. The illuminator 85 is disposed on the side (Z1 direction side) opposite to the lens unit 84 with respect to the transparent member 83. The illuminator 85 emits visible light downward (Z2 direction side). In addition, the illuminator 85 is turned on at least when the base cameras 7 or the scan camera 44 captures an image. That is, when the first correction mark 81 or the second correction mark 82 is imaged by the base cameras 7 or the scan camera 44, light is emitted from the illuminator 85.

Effects of Embodiment

According to the present embodiment, the following effects can be obtained.

According to the present embodiment, as described above, the component mounting device 100 includes the mark projectors 8 that project the first correction mark 81 to the first height H1 and project the second correction mark 82 to the second height H2. Thus, a member that disposes the first correction mark 81 and a member that disposes the second correction mark 82 can be provided as one common mark projector 8, and thus an increase in the number of components can be significantly reduced or prevented. Consequently, it is possible to simplify the structure of the component mounting device 100 in which a plurality of correction marks are disposed at different heights and downsize the component mounting device 100.

According to the present embodiment, each of the mark projectors 8 includes the first projection target 831 projected as the first correction mark 81, the second projection target 832 projected as the second correction mark 82, and the lens unit 84 that projects the first projection target 831 as the first correction mark 81 to the first height H1 and projects the second projection target 832 as the second correction mark 82 to the second height H2. Thus, the lens unit 84 projects the first projection target 831 such that the first correction mark 81 can be easily projected, and the lens unit 84 projects the second projection target 832 such that the second correction mark 82 can be easily projected.

According to the present embodiment, the first projection target 831 is disposed further away from the lens unit 84 than the second projection target 832 in the optical axis direction of the lens unit 84. Thus, the height of the first correction mark 81 and the height of the second correction mark 82 can easily be made different from each other.

According to the present embodiment, the first projection target 831 is disposed on one of the flat surfaces of the transparent member 83, and the second projection target 832 is disposed on the other of the flat surfaces of the transparent member 83. Thus, the first projection target 831 and the second projection target 832 can be provided on one transparent member 83, and thus an increase in the number of components can be further significantly reduced or prevented. Consequently, it is possible to downsize the mark projectors 8 and simplify the structure thereof, and thus it is possible to further downsize the component mounting device 100 and simplify the structure thereof.

According to the present embodiment, the first projection target 831 is disposed such that the optical axis of the lens unit 84 passes substantially through the center of the first projection target 831. Furthermore, the second projection target 832 is disposed such that the optical axis of the lens unit 84 passes substantially through the center of the second projection target 832. Thus, distortion of the projected first correction mark 81 and second correction mark 82 can be significantly reduced or prevented, and thus accurate position correction can be performed using the first correction mark 81 and the second correction mark 82.

According to the present embodiment, the first projection target 831 and the second projection target 832 do not overlap each other as viewed in the optical axis direction of the lens unit 84. Thus, projection of the first correction mark 81 and the second correction mark 82 in an overlapping manner can be significantly reduced or prevented, and thus the first correction mark 81 can be accurately recognized based on the imaging results by the base cameras 7. In addition, the second correction mark 82 can be accurately recognized based on the imaging result by the scan camera 44.

According to the present embodiment, the first projection target 831 and the second projection target 832 have planar shapes different from each other. Thus, erroneous recognition of the first correction mark 81 and the second correction mark 82 imaged by the base cameras 7 or the scan camera 44 can be significantly reduced or prevented, and thus the first correction mark 81 and the second correction mark 82 can be accurately recognized.

According to the present embodiment, the first projection target 831 is disposed inside the second projection target 832 as viewed in the optical axis direction of the lens unit 84. Thus, the first projection target 831 and the second projection target 832 can be disposed on the optical axis, and thus distortion of the projected first correction mark 81 and second correction mark 82 can be significantly reduced or prevented. Furthermore, the first projection target 831 and the second projection target 832 can be disposed compactly, and thus the mark projectors 8 can be downsized.

According to the present embodiment, each of the mark projectors 8 includes the illuminator 85 that emits light to the first projection target 831 and the second projection target 832. Thus, the first correction mark 81 and the second correction mark 82 can be projected by emitting light to the first projection target 831 and the second projection target 832, and thus the first correction mark 81 and the second correction mark 82 can be clearly projected.

According to the present embodiment, the pair of mark projectors 8 are provided at the predetermined interval in the horizontal direction (direction X). Thus, the correction marks can be disposed at two locations in the direction X. Consequently, when distortion occurs in the head unit 4 due to heat or the like, for example, a plurality of reference positions for the head unit 4 can be recognized with the correction marks, and thus positional deviation due to the distortion can be accurately corrected.

According to the present embodiment, the component mounting device 100 includes the base cameras 7 fixedly provided on a main body of the component mounting device and focused at the first height H1 and the scan camera 44 movably provided on the head unit 4 and focused at the second height H2. Thus, the components 31 located at the first height H1 are imaged by the base cameras 7 such that position correction can be accurately performed. Furthermore, the components 31 located at the second height H2 are imaged by the scan camera 44 such that position correction can be accurately performed.

According to the present embodiment, the mark projectors 8 are provided on the head unit 4, and project the first correction mark 81 and the second correction mark 82 downward (direction Z2). Thus, the components 31 held by the mounting heads 42 can be imaged together with the first correction mark 81 or the second correction mark 82, and thus the positions of the components 31 can be accurately corrected. Consequently, the components 31 can be accurately mounted on the substrate P.

Modified Examples

The embodiment disclosed this time must be considered as illustrative in all points and not restrictive. The range of the present disclosure is not shown by the above description of the embodiment but by the scope of claims for patent, and all modifications (modified examples) within the meaning and range equivalent to the scope of claims for patent are further included.

For example, while the example in which the present disclosure is applied to the component mounting device as a substrate working device has been shown in the aforementioned embodiment, the present disclosure is not restricted to this. The present disclosure may be applied to a device other than the component mounting device. For example, the present disclosure may be applied to an inspection device that inspects a substrate on which components are mounted. Alternatively, the present disclosure may be applied to a printer that prints solder or the like on a substrate on which components are mounted. Alternatively, the present disclosure may be applied to a coating device that applies solder, adhesive, or the like to a substrate on which components are mounted. In addition, the imagers may not image components based on visible light. For example, the imagers may image components based on infrared light, X-rays, or the like.

While the example in which the two mark projectors are provided has been shown in the aforementioned embodiment, the present disclosure is not restricted to this. According to the present disclosure, one mark projector may be provided, or three or more mark projectors may be provided.

Figure 6:
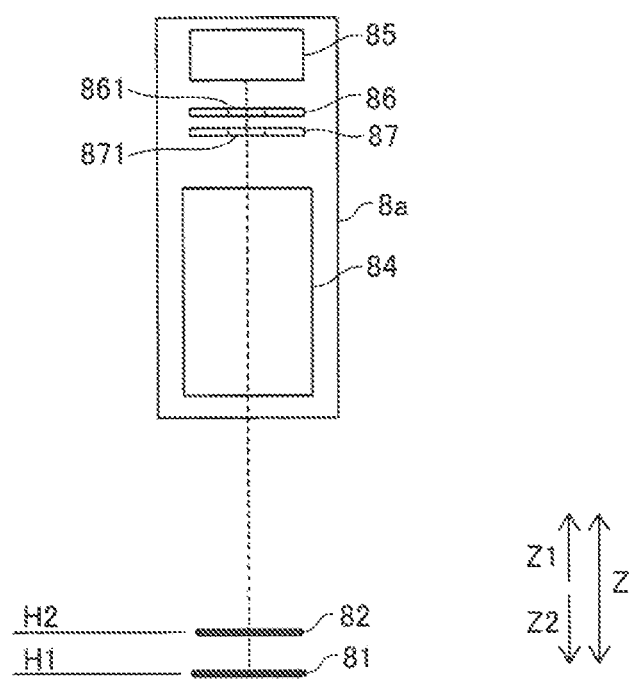
FIG. 6 is a diagram illustrating a mark projector of a component mounting device according to a first modified example of the embodiment of the present disclosure.

While the example in which the first projection target and the second projection target are respectively disposed on the upper surface and the lower surface of one transparent member has been shown in the aforementioned embodiment, the present disclosure is not restricted to this. According to the present disclosure, as a mark projector 8a in a first modified example shown in FIG. 6, a member 86 on which a first projection target 861 is disposed and a member 87 on which a second projection target 871 is disposed may be separately provided.

While the example in which the first projection target is disposed inside the second projection target as viewed in the optical axis direction has been shown in the aforementioned embodiment, the present disclosure is not restricted to this. According to the present disclosure, the second projection target may be disposed inside the first projection target as viewed in the optical axis direction. Alternatively, the first projection target and the second projection target may be disposed side by side in a direction perpendicular to the optical axis direction.

While the example in which the first projection target has a circular shape, and the second projection target has a quadrangular frame shape has been shown in the aforementioned embodiment, the present disclosure is not restricted to this. According to the present disclosure, the first projection target may have a shape other than a circular shape. Furthermore, the second projection target may have a shape other than a quadrangular frame shape. Alternatively, the first projection target and the second projection target may have the same shape. Alternatively, the size of the first projection target and the size of the second projection target may be the same as each other.

While the example in which the correction marks are used to correct the positions and orientations of the components has been shown in the aforementioned embodiment, the present disclosure is not restricted to this. According to the present disclosure, for example, the correction marks may be used to correct the position of the working unit, or the correction marks may be used to correct the position of the substrate. Alternatively, the correction marks may be used to correct the positions of the imagers.

While the example in which the mark projectors are disposed in the head unit as the working unit has been shown in the aforementioned embodiment, the present disclosure is not restricted to this. According to the present disclosure, the mark projectors may be disposed in a portion other than the working unit.

Figure 7:
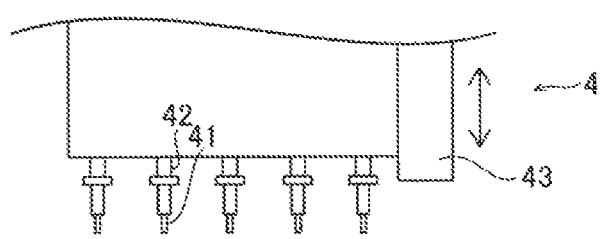
FIG. 7 is a diagram illustrating a mark projector of a component mounting device according to a second modified example of the embodiment of the present disclosure.
Figure 7:
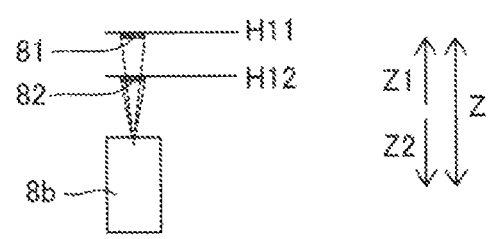

While the example in which the first correction mark and the second correction mark are projected downward from the mark projectors has been shown in the aforementioned embodiment, the present disclosure is not restricted to this. According to the present disclosure, as shown in FIG. 7, the first correction mark 81 and the second correction mark 82 may be projected upward from a mark projector 8b. In this case, for example, the projected first correction mark 81 and second correction mark 82 may be imaged by the substrate recognition camera 43. The substrate recognition camera 43 may include a camera that images a first height H11 and a camera that images a second height H12. In addition, the substrate recognition camera 43 may be movable in the upward-downward direction to a position at which the first height H11 is imaged and a position at which the second height H12 is imaged. Furthermore, when the imager moves in the upward-downward direction, the correction marks are imaged at two locations such that distortion of an upward-downward movement axis can be recognized.

While the example in which each of the mark projectors includes the illuminator has been shown in the aforementioned embodiment, the present disclosure is not restricted to this. According to the present disclosure, the illuminator may not be provided in each of the mark projectors. For example, light may be emitted to the first projection target and the second projection target by illuminators provided in the vicinity of the imagers. In other words, light may not be emitted from the back of the first projection target and the second projection target toward the lens unit.

While the example in which one mark projector projects the two correction marks (the first correction mark and the second correction mark) has been shown in the aforementioned embodiment, the present disclosure is not restricted to this. According to the present disclosure, one mark projector may project three or more correction marks to heights different from each other.

What is claimed is:

1. A substrate working device comprising:
   a working unit arranged above a substrate, and configured to perform work on a substrate on which a component is mounted;
   an imager arranged separated from a correction mark for position correction, in an upward-downward direction, and configured to image the correction mark, the imager including a first imager focused at a first height and a second imager focused at a second height different from the first height; and a mark projector configured to project the correction mark, such that the correction mark includes a first correction mark and a second correction mark, the mark projector is arranged at a position where the first correction mark is projected at the first height and at a position where the second correction mark is projected at the second height, and the mark projector is configured to project the first correction mark to the first height and is configured to project the second correction mark to the second height which is different from the first height, wherein the mark projector includes a first projection target projected as the first correction mark, a second projection target projected as the second correction mark, and a lens unit assembly configured to project the first projection target as the first correction mark to the first height and configured to project the second projection target as the second correction mark to the second height.

2. The substrate working device according to claim 1, wherein
the first projection target is disposed further away from the lens unit than the second projection target is disposed away from the lens unit, in an optical axis direction of the lens unit.

3. The substrate working device according to claim 2, wherein
the mark projector further includes a transparent member having a flat plate shape and including a pair of flat surfaces that face each other in the optical axis direction of the lens unit, and
the first projection target is disposed on one of the flat surfaces of the transparent member, and the second projection target is disposed on an other of the flat surfaces of the transparent member.

4. The substrate working device according to claim 1, wherein
the first projection target is disposed such that an optical axis of the lens unit passes substantially through a center of the first projection target, and
the second projection target is disposed such that the optical axis of the lens unit passes substantially through a center of the second projection target.

5. The substrate working device according to claim 1, wherein
the first projection target and the second projection target do not overlap each other as viewed in an optical axis direction of the lens unit.

6. The substrate working device according to claim 1, wherein
the first projection target and the second projection target have planar shapes different from each other.

7. The substrate working device according to claim 1, wherein
one of the first projection target and the second projection target is disposed inside an other of the first projection target and the second projection target as viewed in an optical axis direction of the lens unit.

8. The substrate working device according to claim 1, wherein
the mark projector further includes an illuminator configured to emit light to the first projection target and the second projection target.

9. The substrate working device according to claim 1, wherein
the mark projector includes a pair of mark projectors provided at a predetermined interval in a horizontal direction.

10. A component mounting device comprising:
a mounting head configured to mount a component on a substrate;
an imager arranged separated from a correction mark for position correction, in an upward-downward direction, and configured to image the correction mark, the imager including a first imager focused at a first height and a second imager focused at a second height different from the first height; and
a mark projector configured to project the correction mark, such that the correction mark includes a first correction mark and a second correction mark, the mark projector is arranged at a position where the first correction mark is projected at the first height and at a position where the second correction mark is projected at the second height, and the mark projector is configured to project the first correction mark to the first height and is configured to project the second correction mark to the second height which is different from the first height, wherein
the mark projector includes a first projection target projected as the first correction mark, a second projection target projected as the second correction mark, and a lens unit assembly configured to project the first projection target as the first correction mark to the first height and configured to project the second projection target as the second correction mark to the second height.

11. The component mounting device according to claim 10, wherein
the mark projector is provided on the mounting head, and is configured to project the first correction mark and the second correction mark downward.

12. The component mounting device according to claim 11, wherein
the imager includes a first imager fixedly provided on a main body of the component mounting device and focused at the first height and a second imager movably provided on the mounting head and focused at the second height.

13. The substrate working device according to claim 2, wherein
the first projection target is disposed such that an optical axis of the lens unit passes substantially through a center of the first projection target, and
the second projection target is disposed such that the optical axis of the lens unit passes substantially through a center of the second projection target.

14. The substrate working device according to claim 3, wherein
the first projection target is disposed such that an optical axis of the lens unit passes substantially through a center of the first projection target, and
the second projection target is disposed such that the optical axis of the lens unit passes substantially through a center of the second projection target.

15. The substrate working device according to claim 2, wherein
the first projection target and the second projection target do not overlap each other as viewed in the optical axis direction of the lens unit.

16. The substrate working device according to claim 2, wherein
   the first projection target and the second projection target have planar shapes different from each other.

17. The substrate working device according to claim 2, wherein
   one of the first projection target and the second projection target is disposed inside an other of the first projection target and the second projection target as viewed in the optical axis direction of the lens unit.

18. The substrate working device according to claim 2, wherein
   the mark projector further includes an illuminator configured to emit light to the first projection target and the second projection target.

19. The substrate working device according to claim 1, wherein the mark projector includes a pair of mark projectors provided at a predetermined interval in a horizontal direction.

* * * * *